United States Patent
Emesh et al.

(10) Patent No.: US 6,802,955 B2
(45) Date of Patent: Oct. 12, 2004

(54) METHOD AND APPARATUS FOR THE ELECTROCHEMICAL DEPOSITION AND PLANARIZATION OF A MATERIAL ON A WORKPIECE SURFACE

(75) Inventors: Ismail Emesh, Gilbert, AZ (US); Periya Gopalan, Chandler, AZ (US); Phillip M. Rayer, II, Chandler, AZ (US); Bentley J. Palmer, Chandler, AZ (US)

(73) Assignee: Speedfam-Ipec Corporation, Chandler, AZ (US)

( * ) Notice: Subject to any disclaimer, the term of this patent is extended or adjusted under 35 U.S.C. 154(b) by 0 days.

(21) Appl. No.: 10/044,514

(22) Filed: Jan. 11, 2002

(65) Prior Publication Data

US 2003/0132120 A1 Jul. 17, 2003

(51) Int. Cl.[7] .................................................. B23H 3/00
(52) U.S. Cl. .................. 205/662; 205/663; 205/668; 205/87; 205/222; 205/205; 204/212; 204/224 M; 204/275.1
(58) Field of Search .................. 205/662, 663, 205/668, 87, 222, 205; 204/212, 224 M, 275.1

(56) References Cited

U.S. PATENT DOCUMENTS

| 5,911,619 | A | 6/1999 | Uzoh et al. |
| 6,176,992 | B1 | 1/2001 | Talieh |
| 6,251,236 | B1 | 6/2001 | Stevens |
| 6,328,872 | B1 | 12/2001 | Talieh et al. |
| 6,491,808 | B2 * | 12/2002 | Ichinose et al. ............ 205/646 |

FOREIGN PATENT DOCUMENTS

| EP | 1103346 | 5/2001 |
| EP | 1104013 | 5/2001 |

* cited by examiner

Primary Examiner—Wesley A. Nicolas
(74) Attorney, Agent, or Firm—Ingrassia Fisher & Lorenz PC

(57) ABSTRACT

An electrochemical apparatus is provided which deposits material onto or removes material from the surface of a workpiece. The apparatus comprises a polishing pad and a platen which is in turn comprised of a first conductive layer in contact with the polishing pad and coupled to a first potential, a second conductive layer coupled to a second potential, and a first insulating layer disposed between the first and second conductive layers. At least one electrical contact is positioned within the polishing pad and is electrically coupled to the second conductive layer. A reservoir is provided which places an electrolyte solution in contact with the polishing pad and the workpiece. A carrier positions and/or presses the workpiece against the polishing pad.

31 Claims, 6 Drawing Sheets

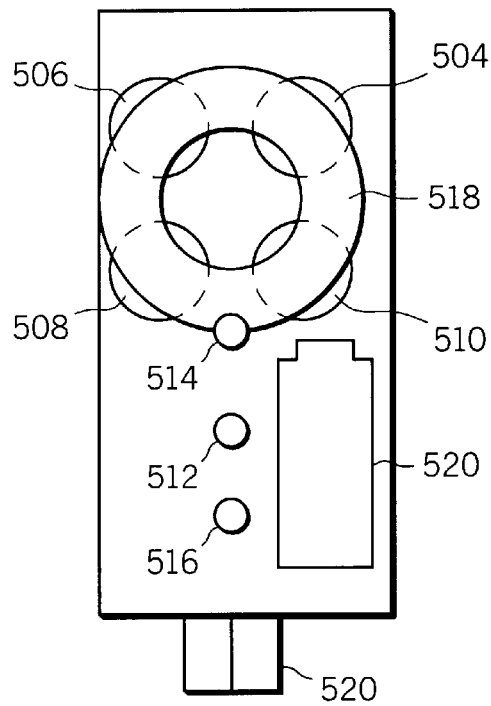
FIG. 5  500
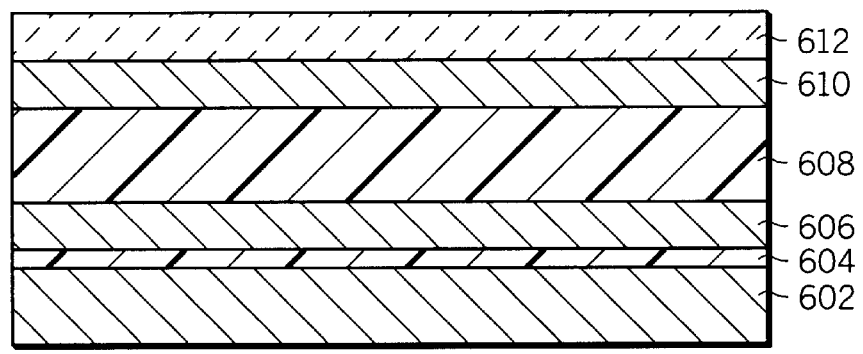
600   FIG. 6

METHOD AND APPARATUS FOR THE ELECTROCHEMICAL DEPOSITION AND PLANARIZATION OF A MATERIAL ON A WORKPIECE SURFACE

TECHNICAL FIELD

This invention relates generally to techniques for depositing conductive material and/or for removing conductive material from a workpiece such as a semiconductor wafer. More particularly, this invention relates to an apparatus, a system, and a method for electrolytically depositing and/or planarizing a conductive material on a workpiece surface and polishing the surface of the workpiece to remove a portion of the conductive material. Still more particularly, this invention relates to the deposition and/or planarization of copper on a workpiece surface.

BACKGROUND OF THE INVENTION

Chemical mechanical polishing (CMP) is a technique which has been conventionally used for the planarization of semiconductor wafers. For example, see U.S. Pat. No. 5,099,614, issued in March in 1992 to Riarai et al; U.S. Pat. No. 5,329,732 issued July 1994 to Karlsrud et al, and U.S. Pat. No. 5,498,199 issued March 1966 to Karlsrud et al. Furthermore, chemical mechanical polishing is often used in the formation of microelectriconic devices to provide a substantially smooth, planar surface suitable for subsequent fabrication processes such as photoresist coating and pattern definition. A typical chemical mechanical polishing apparatus suitable for planarizing a semiconductor surface generally includes a wafer carrier configured to support, guide, and apply pressure to a wafer during the polishing process, a polishing compound such as a slurry to assist in the removal of material from the surface of the wafer, and a polishing surface such as a polishing pad. In addition, the polishing apparatus may include an integrated wafer cleaning system and/or an automated load/unload station to facilitate automatic processing of the wafers.

A wafer surface is generally polished by moving the surface of the wafer to be polished relative to the polishing surface in the presence of a polishing compound. In particular, the wafer is placed in a carrier such that the surface to be polished is placed in contact with the polishing surface, and the polishing surface and the wafer are moved relative to each other while slurry is supplied to the polishing surface.

Chemical mechanical polishing may also be used to form microelectronic features. For example, a conductive feature such as a metal line, conductive plug, or the like may be formed on a surface of a wafer by forming trenches and vias on the wafer surface, depositing conductive material over the wafer surface and into the trenches and vias, and removing the conductive material on the surface of the wafer using chemical mechanical polishing, leaving the vias and trenches filled with conductive material. The conductive features often include a barrier material to reduce unwanted diffusion of the conductive material and to promote adhesion between the conductive material and any adjacent layer of the circuit.

Aluminum is often used to form conductive features because its characteristics are compatible with conventional deposition (e.g. chemical vapor deposition) and etch (e.g., reactive ion etch) techniques. While the use of aluminum to form conductive features is adequate in some cases, the use of aluminum in the formation of conductive features becomes increasingly problematic as the size of the conductive feature decreases. In particular, as the size of the conductive feature decreases, the current density through the feature generally increases, and thus the feature becomes increasingly susceptible to electromigrations; i.e., the mass transport of metal due to the flow of current. Electromigration may cause short circuits where the metal accumulates, open circuits where the metal has been depleted, and/or other circuit failures. Similarly, increased conductive feature resistance may cause unwanted device problems such as access power consumption and heat generation.

Recently, techniques have been developed which utilize copper to form conductive features because copper is less susceptible to electromigration and exhibits a lower resistivity than aluminum. Since copper does not readily form volatile or soluble compounds, the copper conductive features are often formed using damascene. More particularly, the copper conductive features are formed by creating a via within an insulating material, depositing a barrier layer onto the surface of the insulating material and into the via, depositing a seed layer of copper into the barrier layer, electrodepositing a copper layer onto the seed layer to fill the via, and removing any excess barrier metal and copper from the surface of the insulating material using chemical and mechanical polishing. During the electrodeposition process, additives such as leveling agents may be added to the plating bath to reduce the formation of voids within the conductive features.

Forming copper conductive features according to the method described above can be relatively expensive, in part because each material deposition and removal step is typically carried out using dedicated equipment. U.S. Pat. No. 6,176,922, issued to Talieh on Jan. 23, 2001, discloses an apparatus for both electroplating and polishing copper. The apparatus disclosed includes a wafer carrier having a cathode electrode contact that contacts the surface of the wafer to be polished. Unfortunately, the apparatus shown in Taleih is problematic is several ways. In particular, a film deposited using the apparatus of Taleih may be undesirably non-uniform because the cathode electrode contacts the wafer in a limited number of fixed locations about the perimeter of the wafer. Such a cathode contact configuration may lead to increased deposition about the perimeter of the wafer, i.e., in the areas proximate to the cathode contact, and thus lead to non-uniform deposition of the conduct film. Furthermore, wafer areas in contact with the cathode generally cannot include active devices.

As stated previously, the CMP machine typically includes a wafer carrier configured to hold, rotate, and transport a wafer during the process of polishing or planarizing the wafer. During the planarizing operation, a pressure applying element (e.g., a rigid plate, a bladder assembly, or the like) that may be an integral part of the wafer carrier, applies pressure such that the wafer engages a polishing surface with a desired amount of force. The carrier and the polishing surface are rotated, typically at different rotational velocities, to cause relative lateral motion between the polishing surface and the wafer and to promote uniformed planarization. The polishing surface generally comprises a horizontal polishing pad that may be formed of various materials such as blown polyurethane and are available commercially from, for example, Rodel Inc. located in Phoenix, Ariz. An abrasive slurry may also be applied to the polishing surface which acts to chemically weaken the molecular bonds at the wafer surface so that the mechanical action of the polishing pad and slurry abrasive can remove the undesirable material from the wafer surface.

Unfortunately, the CMP process tends to leave stresses in the worked workpiece leading to subsequent cracking and shorting between metal layers. Furthermore, the CMP process may result in sheering or crushing of fragile layers. This process also has a tendency to cause dishing in the center of wide metal features, such as trenches and vias, oxide erosion between metal features, and dielectric oxide loss. Electrochemical planarization is an attractive alternative to CMP because it does not impart significant mechanical stresses to the workpiece, and consequently does not significantly reduce the integrity of the devices. Furthermore, electrochemical planarization is less likely to cause dishing, oxide erosion, and oxide loss of the dielectric layer.

Electrochemical planarization is based on electroetching and electrochemical machining; that is, the removal of a thin layer of metal from a substrate through the action of an electrical solution and electricity. For example, if two electrodes, an anode and a cathode, are emerged in a liquid electrolyte and are wired so as to permit a potential difference between the electrodes, metal atoms in the anode are ionized by the electricity and go into the solution as ions. Depending on the chemistry of the metals and salt, the metal ions from the anode either plate the cathodes, fall out as precipitate, or remain in solution. Unfortunately, using conventional electrochemical planarization techniques, etching selectivity is reduced in areas of large dimension, high and low topography on the wafer, and uniform planarization is not achieved.

In view of the foregoing, it should be appreciated that it would be desirable to provide improved methods and apparatus for the electrochemical deposition and/or planarization of a metal on a workpiece such as a semiconductor wafer.

SUMMARY OF THE INVENTION

In accordance with an aspect of the invention, there is provided an apparatus for performing an electrochemical process on the surface of a workpiece. The apparatus includes a polishing pad and a platen which includes a first conductive layer in contact with the polishing pad and coupled to a first potential, a second conductive layer coupled to a second potential, and a first insulating layer disposed therebetween. At least one electrical contact is positioned within the polishing pad and is electrically coupled to the second conductive layer. A reservoir is utilized to provide electrolyte solution and place it in contact with the polishing pad and the workpiece. Finally, a carrier is configured to carry the workpiece and press it against the polishing pad.

In accordance with a further aspect of the invention, there is provided a platen for use in an electrochemical process. The platen comprises a first insulating layer having a first surface and a second surface. The first insulating layer contains at least a first aperture and a second aperture therethrough. At least a first insulating island protrudes from the first surface and is disposed around the first aperture. Similarly, at least a second insulating island protrudes from the second surface and is disposed around the second aperture. A first conductive layer on the first surface surrounds the first insulating island, and a second conductive layer on the second surface surrounds the second insulating island. Finally, a conductive element resides in the first aperture and is electrically coupled to the second conductive layer.

According to a still further aspect of the invention, there is provided a method for depositing material onto or removing material from a surface of a workpiece which comprises the steps of providing a polishing pad, providing a platen comprising a first conductive layer, a second conductive layer, and a first insulating layer therebetween. A first potential is applied to the first conductive layer, a second potential is applied to the second conductive layer, and an electrolyte solution is placed in contact with the polishing pad and the workpiece. The workpiece is pressed against the polishing pad, and relative motion is imparted between the workpiece and the polishing surface.

BRIEF DESCRIPTION OF THE DRAWINGS

The following drawings are illustrative of particular embodiments of the invention and therefore do not limit the scope of the invention, but are presented to assist in providing a proper understanding of the invention. The drawings are not to scale (unless so stated) and are intended for use in conjunction with the explanations in the following detailed description. The present invention will hereinafter be described in conjunction with the appended drawing figures, wherein like numerals and like elements, and:

FIG. 5 is a top cutaway view of a portion of an electrochemical polishing apparatus in accordance with still another embodiment of the present invention;

FIG. 6 is a cross-sectional view of a portion of a platen/polishing pad stack for use in conjunction with the present invention;

DETAILED DESCRIPTION OF EXEMPLARY EMBODIMENTS

The following description is exemplary in nature and is not intended to limit the scope, applicability, or configuration of the invention in any way. Rather, the following description provides a convenient illustration for implementing exemplary embodiments of the invention. Various changes to the described embodiments may be made in the function and arrangement of the elements described herein without departing from the scope of the invention.

Figure 1:
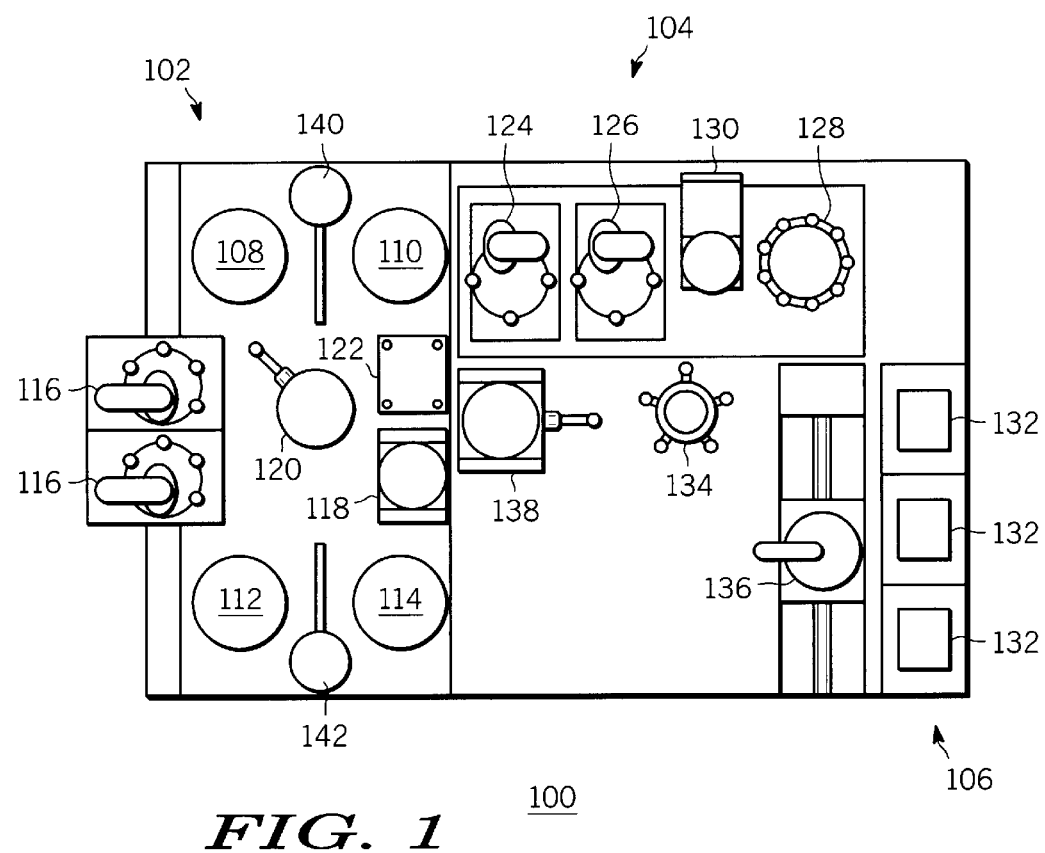
FIG. 1 is a top cutaway view of a polishing system in accordance with the present invention.

FIG. 1 illustrates a top cutaway view of the polishing apparatus 100, suitable for electrochemically depositing or planarizing conductive material on or from the surface of a workpiece in accordance with the present invention. Apparatus 100 includes a multi-station polishing system 102, a clean system 104, and a wafer load/unload station 106. In addition, apparatus 100 includes a cover (not shown) that surrounds apparatus 100 to isolate apparatus 100 from the surrounding environment. In accordance with a preferred embodiment in the present invention, machine 100 is a Momentum machine available from SpeedFan-IPEC Corporation of Chandler, Ariz. However, machine 100 may be any machine capable of removing or depositing material from or onto a workpiece surface.

Although the present invention may be used to remove material or deposit material on the surface of a variety of workpieces such as magnetic disks, optical disks, and the like, the invention is conveniently described below in connection with removing and depositing material on the surface of a wafer. In the context of the present invention, the term "wafer" shall mean semiconductor substrates, which may include layers of insulating, semiconductor, and conducting layers or features formed thereon and used to manufacture microelectronic devices.

Exemplary polishing station 102 includes four polishing stations, 108, 110, 112, and 114, that each operate independently; a buff station 116; a stage 118; a robot 120; and optionally, a metrology station 122. Polishing stations 108–114 may be configured as desired to perform specific functions. In accordance with the present invention, at least one of the stations 108–114 includes an electrochemical deposition and polishing apparatus as described herein. Another one of the stations 108–114 includes electrochemical planarization apparatus as described herein, and the remaining stations may be configured for traditional chemical mechanical polishing or the like.

Polishing system 102 also includes polishing surface conditioners 140 and 142. The configuration of conditioners 140 and 142 generally depend on the type of polishing surface to be conditioned. For example, when the polishing surface comprises a polyurethane polishing pad, conditioners 140 and 142 may include a rigid substrate coated with diamond material. Various other surface conditioners may also be used in accordance with the present invention.

Clean system 104 is generally configured to remove debris such as slurry residue and material from the wafer surface during polishing. In accordance with the illustrated embodiment, system 104 includes clean stations 124 and 126, a spin rinse dryer 128, and a robot 130 configured to transport the wafer between clean stations 124 and 126 and spin rinse dryer 128. Alternatively, clean station 104 may be separate from the remainder of the electrochemical deposition and planarization apparatus. In this case, load station 106 is configured to receive dry wafers for processing, but the wafers may remain in a wet (e.g., deionized water) environment until the wafers are transferred to the clean station. In operation, cassettes 132, including one or more wafers, are loaded onto apparatus 100 at station 106. The wafers are then individually transported to a stage 134 using a dry robot 136. A wet robot 138 retrieves a wafer at stage 132 and transports the wafer to metrology station 122 for film characterization or to stage 118 within polishing system 102. Robot 120 picks up the wafer from metrology station 122 or stage 118 and transports the wafer to one of polishing stations 108–114 for electrochemical deposition or planarization of a conductive material. After a desired amount of material has been deposited or removed, the wafer may be transported to another polishing station. Alternatively, as will be more fully discussed below, a polishing environment within one of the stations may be changed from an environment suitable for the electrochemical deposition to an environment suitable for electrochemical planarization; e.g., by changing the solution and the bias applied to the wafer. In this case, a single polishing station may be used to both deposit material and remove material from the wafer.

After conductive material has been either deposited or removed from the wafer surface, the wafer is transferred to buff station 116 to further polish the surface of the wafer. After the polishing and/or buff process, the wafer is transferred to stage 118 which is configured to maintain one or more wafers in a wet (e.g. deionized water) environment.

After the wafer is placed in stage 118, robot 138 picks up the wafer and transports it to clean system 104. In particular, robot 138 transports the wafer to robot 130, which in turn places the wafer in one of the clean stations 124 or 126. The wafer is cleaned using one or more stations 124 and 126 and then is transported to spin rinse dryer 128 to rinse and dry the wafer prior to transporting it to load/unload station 106 using robot 136.

Figure 2:
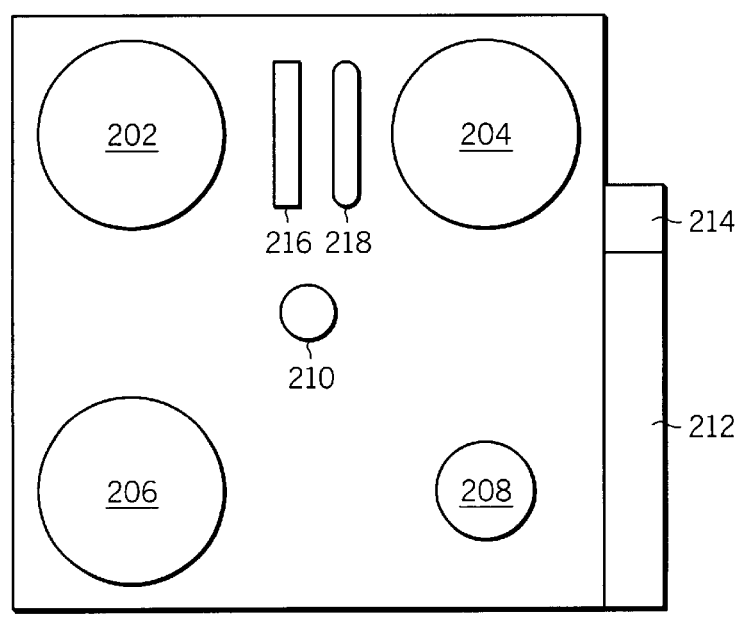
FIG. 2 is a top cutaway view of a portion of an electrochemical polishing apparatus in accordance with another embodiment of the present invention.
Figure 3:
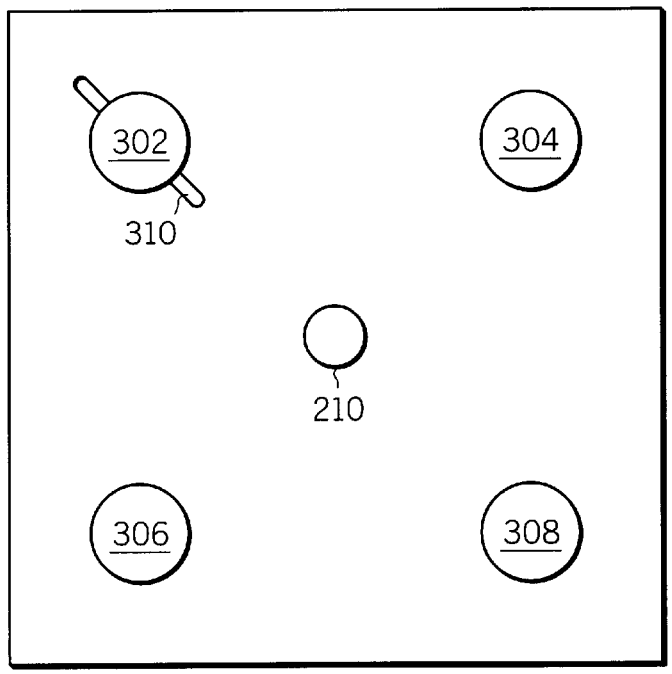
FIG. 3 is a bottom cutaway view of a carousel for use with the apparatus shown in FIG. 2.

FIG. 2 illustrates a top cut away view of another exemplary polishing apparatus 200, configured to electrochemically planarize, electrochemically deposit material onto a wafer, and polish the surface of a wafer to remove a portion of the deposited material. Apparatus 200 is suitably coupled to carousel 300 illustrated in FIG. 3 to form an automated electrochemical deposition, planarization, and polishing system. The system in accordance with this embodiment may also include a removable cover (not shown) overlying apparatus 200 and 300.

Apparatus 200 includes three polishing stations, 202, 204, and 206, a wafer transfer station 208, a center rotational post 210 that is coupled to carousel 300 and which operatively engages carousel 300 to cause carousel 300 to rotate, a load and unload station 212, and a robot 214 configured to transport wafers between stations 212 and 208. Furthermore, apparatus 200 may include one or more rinse washing stations 216 to rinse and/or wash a surface of a wafer before or after a polishing, electrodeposition, or electroplanarization. Although illustrated with three polishing stations, apparatus 200 may include any desired number of polishing stations, and one or more such polishing stations may be used to buff a surface of a wafer. Furthermore, apparatus 200 may include an integrated wafer clean and dry system similar to system 104 described above. Wafer station 208 is generally configured to stage wafers before or between polishing and/or buff operations and may be further configured to wash and/or maintain the wafers in a wet environment.

Carousel apparatus 300 includes polishing heads, or carriers, 302, 304, 306, and 308, each configured to hold a single wafer and urge the wafer against the polishing surface (e.g., a polishing surface associated with one of stations 202–206). Each carrier 302–308 is suitably spaced from post 210 such that each carrier aligns with a polishing station or station 208. In accordance with one embodiment of the invention, each carrier 302–308 is attached to a rotatable drive mechanism using a Gimble system (not illustrated) which allows carriers 302–308 to cause a wafer to rotate (e.g., during a polishing process). In addition, the carriers may be attached to a carrier motor assembly that is configured to cause the carriers to translate as, for example, along tracks 310. Furthermore, each carrier 302–308 may rotate and translate independently of the other carriers.

In operation, wafers are processed using apparatus 200 and 300 by loading a wafer onto station 208 from station 212 using robot 214. When a desired number of wafers are loaded onto the carriers, at least one of the wafers is placed in contact with the polishing surface. The wafer may be positioned by lowering a carrier to place the wafer surface in contact with the polishing surface, or a portion of the carrier (e.g., a wafer holding surface) may be lowered to position the wafer in contact with the polishing surface. After polishing is complete, one or more conditioners 218 may be employed to condition the polishing surfaces.

Figure 4:
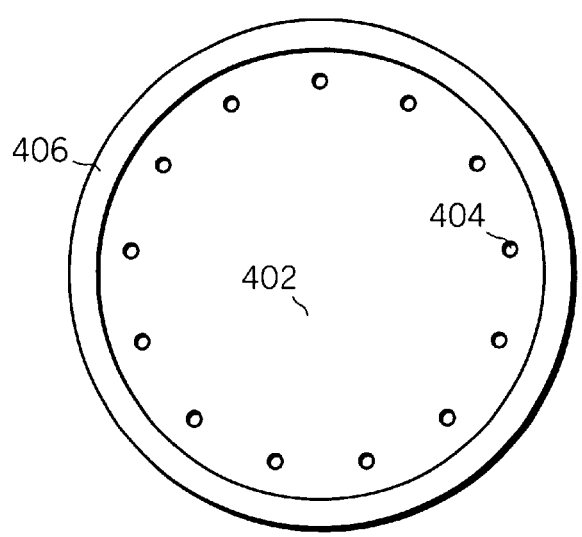
FIG. 4 is a top plan view of a typical workpiece carrier for use in conjunction with the inventive electrochemical deposition apparatus.

During a polishing process, a wafer may be held in place by a carrier 400, illustrated in FIG. 4. Carrier 400 comprises a retaining ring 406 and a receiving plate 402 including one or more apertures 404. Apertures 404 are designed to assist retention of a wafer by carrier 400 by, for example, allowing a vacuum pressure to be applied to the backside of the wafer or by creating enough surface tension to retain the wafer. Retaining ring 406 limits the movement of the wafer during the polishing process.

FIG. 5 illustrates another polishing system 500 in accordance with the present invention. It is suitably configured to receive a wafer from a cassette 502 and return the wafer to the same or to a predetermined different location within the cassette in a clean common dry state. System 500 includes polishing stations 504 and 506, a buff station 508, a head loading station 510, a transfer station 512, a wet robot 514, a dry robot 516, a rotatable index table 518, and a clean station 520. Dry robot 516 unloads a wafer from cassette 502 and places the wafer on transfer station 512. The wafer then travels to polishing stations 504–508 for polishing and returns to station 510 for unloading by robot 514 and station 512. The wafer is then transferred to clean system 520 to clean, rinse, and dry the wafer before the wafer is returned to load and unload station 502 using dry robot 516.

FIG. 6 is a cross-sectional view of a portion of a platen/polishing pad stack 600 which may be utilized to perform electrochemical deposition, planarization, and polishing (e.g., a portion of one of stations 108–114 in FIG. 1 or stations 202–206 in FIG. 2). Stack 600 includes a platen support member 602 constructed of a suitable material (e.g. titanium, stainless steel), a first electrically conductive layer 606 (e.g. copper), an insulating layer 604 (e.g. plastic) electrically isolating layer 606 from support member 602 for reasons which will become apparent, a second insulating layer 608 (e.g. a ceramic or a non-electrically conductive polymer such as plastic), and a second electrically conductive layer 610 (e.g. copper having a thickness of between 0.1 cm and 3 cm; preferably 1 cm) having a polishing pad 612 disposed thereon. Polishing pad 612 is suitably formed of an insulating material such as a polymeric material, a polymeric/inorganic composite material, or a ceramic insulation material. The hardness and density of the polishing surface are selected based on the type of material to be polished or removed. Polyurethane polishing pads are available from Rodel Inc. of Phoenix, Ariz. and may be advantageously used to polish a wafer although it should be appreciated that any suitable polishing surface could be used.

Figure 7:
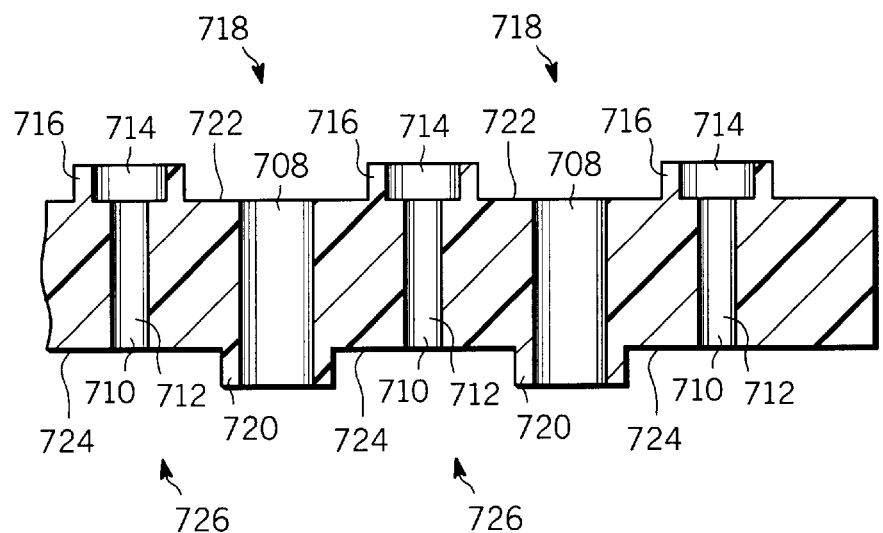
FIG. 7 is a cross-sectional view illustrating the details of the plastic layer shown in FIG. 6.

FIG. 7 is a cross-sectional view illustrating insulating layer 608 in more detail. Layer 608 includes an upper surface 722, a lower surface 724, and a plurality of openings therethrough. For example, apertures 708 are provided through which electrolyte (e.g., a copper sulfate electrolyte known as EC2001 and additives available from Shipley) may flow from a reservoir (not shown). Layer 608 also includes a plurality of apertures 710 which receive conductive pins therethrough for making electrical contact to copper layer 606. As can be seen, apertures 710 include a region 712 of reduced dimension (e.g. diameter) for receiving the stem of a conductive pin (e.g. copper) and a region 714 of an increased dimension for receiving the head of the copper pin which ultimately makes electrical contact with a wafer to be polished or on which copper is to be deposited as will be described hereinbelow. The upper surface of layer 608 has a plurality of insulating islands 716 formed thereon which insulate the conductive pins from a layer of copper which will be formed on surface 722 in recessed regions 718 between adjacent insulating islands 716 as will be described more fully below. Similarly, a plurality of insulating wells 720 are provided around apertures 710 creating recessed regions 726.

Figure 8:
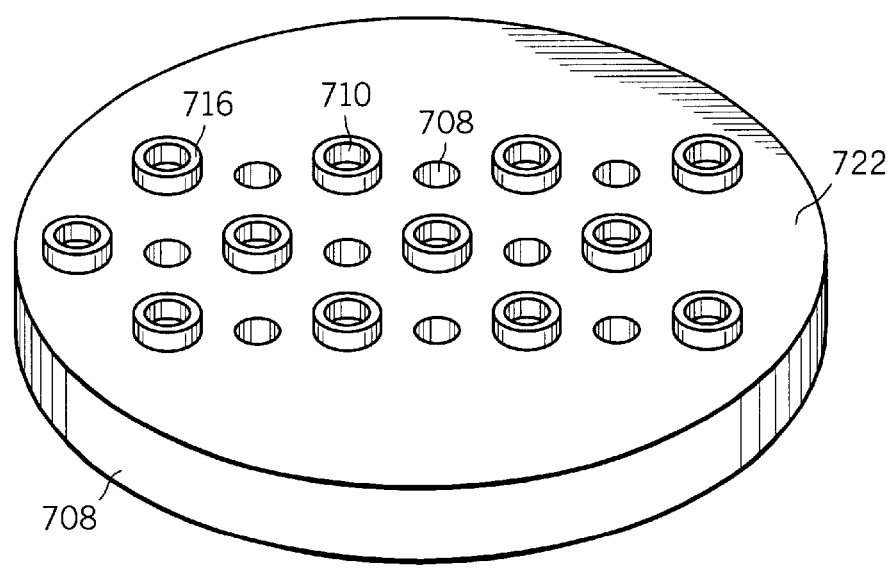
FIG. 8 is an isometric view of the upper surface of the plastic insulator shown in FIG. 7.

Insulating islands 716 are shown more clearly in FIG. 8 which is a perspective view of the upper portion of layer 608. As can be seen, layer 608 is provided with a plurality of insulating wells 716 protruding above surface 722. Apertures 708 are also visible in FIG. 8 and, as explained earlier, are provided to enable delivery of an electrolyte solution from a reservoir to a wafer. Eventually, copper layer 610 will be disposed on surface 722 and surround insulating wells 716. The upper surface of copper layer 610 will be coplanar with the upper surface of insulating wells 716. In a similar fashion, copper layer 606 will be deposited in regions 726 on lower surface 724 between insulating wells 720.

Figure 9:
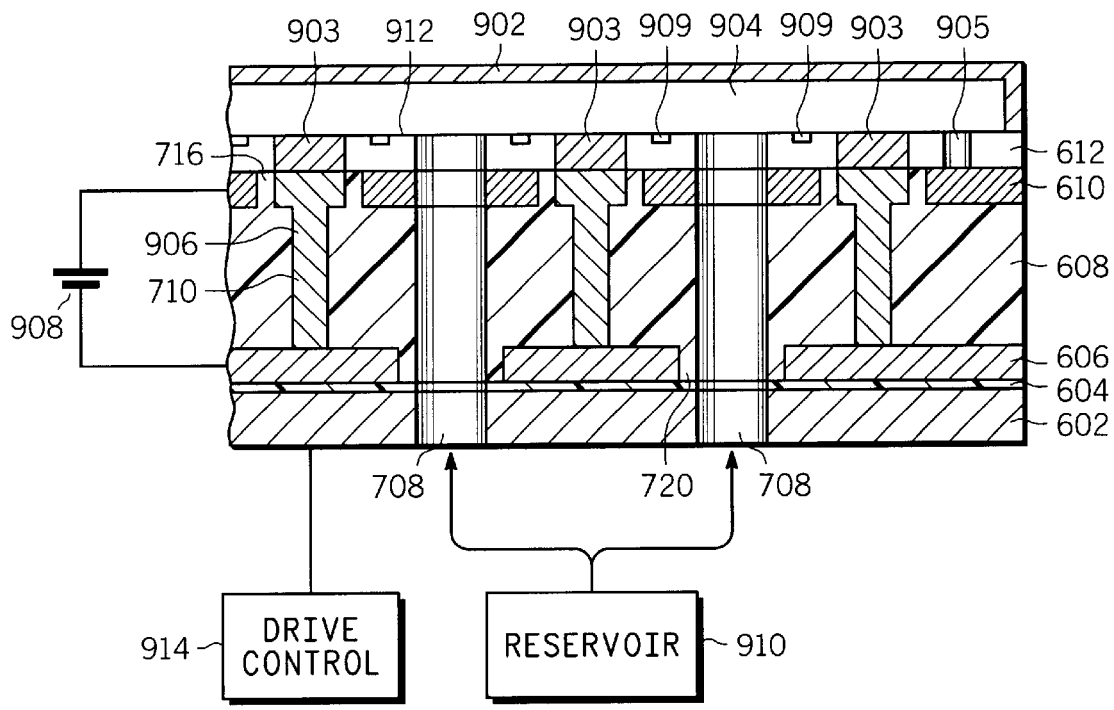
FIG. 9 is a cross-sectional view of a portion of an electrochemical deposition apparatus in accordance with an exemplary embodiment of the present invention.

In accordance with one embodiment of the invention, apparatus 900 shown in FIG. 9 is configured to perform electrochemical deposition, electrochemical planarization, and/or polishing, utilizing the platen/polishing pad stack shown in FIG. 6. Apparatus 900 includes stack 600 shown in FIG. 6, a wafer carrier assembly 902, a wafer 904, a source of potential 908, a source of temperature controlled electrolytic solution 910, and drive controller 914. In general, apparatus 900 is configured to electrochemically deposit onto or remove material from surface 912 of semiconductor wafer 904 retained by carrier assembly 902. Apparatus 900 is further configured to polish surface 912.

Copper layer 610 is disposed on the upper surface of insulating layer 608. The upper surface of copper layer 610 resides between insulating wells 716 and is coplanar with the upper surface thereof so as to present a planar surface to surface 912 of wafer 904. In the case of a deposition process, copper layer 610 is coupled to the anode of a source of supply voltage 908, and the second copper layer 606 disposed between insulating wells 720 is coupled to the cathode of supply voltage 908. By reversing the polarity, the process becomes an electro-polishing process. Finally, insulating layer 604 is provided beneath copper layer 606. It is to be noted that support member 602, insulating layer 604, copper layer 610, and polishing pad 612 likewise have openings therethrough which align with openings 708 to enable delivery of the electrolyte solution from reservoir 910 to the interface between the upper surface of polishing pad 612 and surface 912 of wafer 904. It should be also noted that polishing pad 612 is provided with a plurality of conductive regions 903 (e.g., made from a conductive polymer epoxy and of a hardness substantially equal of that of polishing pad 612) which provide electrical conductivity between copper pins 906 in apertures 710 and wafer 904. Polishing pad 612 is also provided with a plurality of channels or grooves 909 which are configured to effect transportation of the electrolyte solution on the surface of polishing pad 612 and into holes 905 for providing electrical coupling between conductive layer 610 and surface 912 of wafer 904. Holes or apertures 905 preferably have a cumulative cross-sectional area substantially equal to fifty percent of the surface area of surface 912. Furthermore, hoes 905 may be of different sizes or diameters as is shown at 911 and 913 in FIG. 10 to provide a measure of distribution control.

Figure 10:
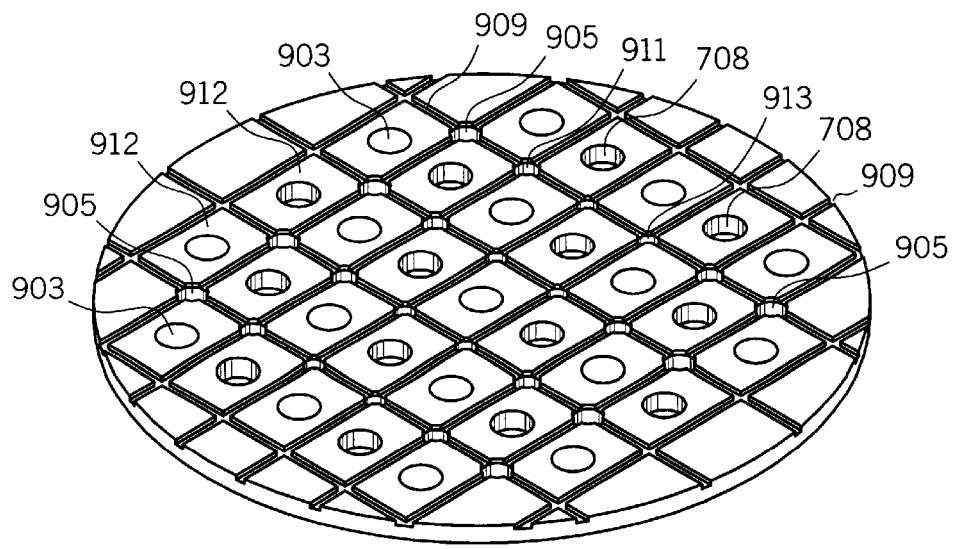
FIG. 10 is an isometric view illustrating the upper surface of the polishing pad employed in the apparatus shown in FIG. 9.

Channels 909, slurry apertures 708, and conductive pads 903 are shown more clearly in FIG. 10 which is a perspective view illustrating the top surface of polishing pad 612. As can be seen, channels 909 form a rectangular grid forming islands 912 which alternately contain conductive pads 903 and slurry openings 708. It should be clear, however, that the pattern of slurry openings, pads, and channels shown in FIG. 10 is given by way of example only. The pads, openings, and channels may be patterned in any manner suitable to achieve the intended purpose.

As stated previously, electrochemical deposition results when the required potential difference is applied between surface 912 of wafer 904 and copper layer 610. The cathode of voltage source 908 is electrically coupled to copper layer 606. Copper layer 606 is electrically coupled through copper pins 906 to conductive pads 903 in polishing pad 612. The anode of power supply 908 is coupled to copper layer 610. Thus, a potential difference has been provided between surface 912 of wafer 904 and layer 610. Since the electrolyte solution is being provided by reservoir 910 through channels 708 to the region between polishing pad 612 and surface 912 of wafer 904, copper is electrochemically deposited on surface 912. Of course, it should be understood that a thin seed layer of copper must first be deposited on wafer 612. This may be accomplished by forming a seed layer of copper on the surface of wafer 904 as, for example, by sputtering, chemical vapor deposition, or any other suitable deposition methods. In particular, power supply 908 applies a relative positive charge to conductive layer 610 and a relative negative charge to copper layer 606. This relative negative charge is transmitted to the surface of wafer 904 by means of copper pins 906 and conductive pads 903 in polishing pad 612. Positioning the heads of pins 906 adjacent pads 903 provides a significant amount of electrical contact area between pads 903 and surface 912 of the wafer 904. This facilitates the creation of a uniform electric potential gradient across the surface of the wafer reducing the likelihood that edge effects and the like may result. Since the cathode electrodes are not attached directly to the surface 912 of wafer 904, a greater amount of surface area of wafer 904 is available for device formation.

The platen assembly having polishing pad 612 disposed thereon is generally configured to move relative to carrier 902 and wafer 904 so as to facilitate polishing of wafer 904 and promote a uniform deposition of material onto surface 912. The platen assembly may be connected to a drive motor assembly 914 that is operative to rotate the platen and polishing surface about a vertical axis. It will be appreciated, however, that the drive or motor assembly may be operative to move the platen assembly and polishing surface in an orbital, linear, rotational, or oscillatory pattern or any combination thereof. For example, U.S. Pat. No. 5,582,534 (Sheldon et al) and U.S. Pat. No. 5,938,884 (Hoshizaki et al) disclose several mechanisms for creating an orbital motion.

Figure 11:
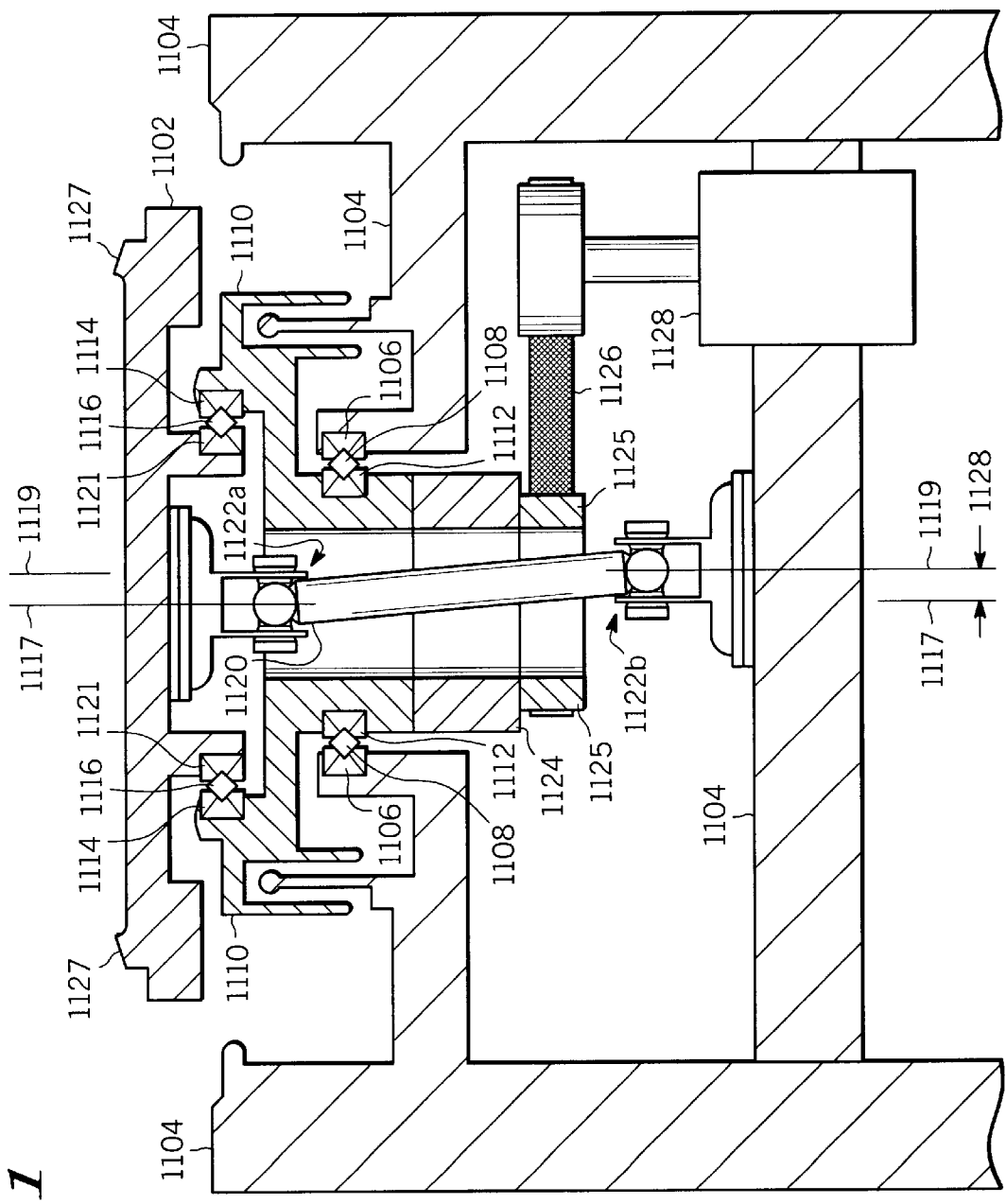
FIG. 11 is a cross-sectional view of an apparatus for producing orbital motion.

FIG. 11 is a cross-sectional view of an exemplary apparatus that may be used to generate an orbital motion for a platen 1102 of the type described above. The supporting base is generally disclosed in U.S. Pat. No. 5,554,064 Breivogel et al. and is hereby incorporated by reference. The supporting base may have a rigid frame 1104 that can be fixedly secured. Stationary frame 1104 is used to provide support and balance. Outside ring 1106 of a lower bearing 1105 is rigidly fixed by clamps to stationary frame 1104. Stationary frame 1104 prevents outside ring 1106 of lower bearing 1108 from rotating. Wave generator 1110 formed of a circular, hollow rigid stainless steel body is clamped to the inside ring 1112 of lower bearing 1108. Wave generator 1110 is also clamped to outside ring 1114 of an upper bearing 1116. Wave generator 1110 positions upper bearing 1116 parallel to lower bearing 1108. Wave generator 1110 offsets the center axis 1117 of upper bearing 1116 from the center axis 1119 of lower bearing 1108. A circular platen 1102 is symmetrically positioned and securely fastened to the inner rings of 1121 of upper bearing 1116. A polishing pad or pad assembly can be securely fastened to ridge 1127 formed around the outside edge of the upper surface of platen 1102.

A universal joint 1120, having two pivot points 1122a and 1122b, is securely fastened to stationary frame 1104 and to the bottom surface of platen 1102. The lower portion of wave generator 1110 is rigidly connected to a hollow and cylindrical drive spool 1124 that in turn is connected to a hollow and cylindrical drive pulley 1125. Drive pulley 1125 is coupled by a belt 1126 to a motor 1128. Motor 1128 may be a variable speed, three phase, two horsepower AC motor.

The orbital motion of platen 1102 is generated by spinning wave generator 1110. Wave generator 1110 is rotated by variable speed motor 1128. As wave generator 1110 rotates, the center axis 1117 of upper bearing 1116 orbits about the center axis 1119 of lower bearing 1108. The radius of the orbit of the upper bearing 1119 is equal to the offset (R) 1128 between the center axis 1117 of upper bearing 1116 and the center axis 1119 of the lower bearing 1108. Upper bearing 1116 orbits about the center axis 1119 of lower bearing 1108 at a rate equal to the rotation of wave generator 1110. It is to be noted that the outer ring 1114 of upper bearing 1116 not only orbits but also rotates (spins) as wave generator 1110 rotates. The function of universal joint 1120 is to prevent torque from rotating or spinning platen 1102. The dual pivot points 1122a and 1122b of universal joint 1120 allow the platen 1102 to move in all directions except a rotational direction. By connecting platen 1102 to the inner ring 1121 of upper bearing 1116 and by connecting universal joint 1120 to platen 1102 and stationary frame 1104 the rotational movement of inner ring 1121 and platen 1102 is prevented and platen 1102 only orbits as desired. The orbit rate of platen 1102 is equal to the rotation rate of wave generator 1110 and the orbit radius of platen 1102 is equal to the offset of the center 1117 of upper bearing 1116 from the center 1117 of lower bearing 1108. It is to be appreciated that a variety of other well-known means may be employed to facilitate the orbital motion of the polishing pad. While a particular method for producing an orbital motion has been given in detail, the present invention may be practiced using a variety of techniques for orbiting the polishing pad on the platen 1102.

The electrolytic solution contained in reservoir 910 includes the suitable precursors to the material being deposited onto the surface of wafer 904 (in this case, copper). Such solutions are generally known in the art and typically include dissolved copper such as copper sulfate, leveling agents, suppressants, and accelerators.

The apparatus of the present invention may include a temperature control mechanism for controlling the temperature of the electrolytic solution since the temperature of the surface of wafer 904 may have a significant effect on the uniformity of the deposited conductive film, the quality of the deposited film, and the rate of deposition or planarization of the film. If, for example, the temperature is too high in a given area, the deposition rate may increase in that area causing non-uniform film deposition on the surface of the wafer. To counteract the generation of localized hot spots, the electrolytic solution in reservoir in 910 may be cooled using any one of a number of known techniques for this purpose. For example, the electro-solution may be subject to a cooler or chiller before being delivered to surface 912 of wafer 904.

A method of simultaneously electrically chemically depositing material onto a surface of a wafer 904 and polishing the surface 812 thereof will now be described. Although the illustrated method includes substantially simultaneously polishing the wafer surface and depositing the material onto the wafer surface, alternate embodiments of the invention include intermittently depositing material onto the surface and polishing the wafer surface.

Referring again to FIG. 9, wafer carrier assembly 902 urges wafer 904 against the polishing surface of pad 912 at a desired temperature. Preferably, the wafer carrier 902 applies a uniform and constant pressure of 3 PSI or less, although it will be appreciated that any suitable pressure which promotes polishing without interfering with the concurrent electrochemical deposition process may be used. Alternatively, to further control the rate of material removal and/or deposition, the wafer carrier may press the wafer against the polishing pad for a predetermined amount of time, subsequently withdraw the wafer from the polishing pad for a predetermined amount of time, and then repeat the pressing/withdrawing pattern for a desired number of times.

During the polishing process, an electrolyte solution is delivered to the surface of polishing pad 612 through channels 708. An electric potential is also applied to create a complete circuit between the platen and surface 912 of wafer 904. Power supply 908 may be configured to (1) apply a constant voltage or constant current, (2) apply different currents or voltages at predetermined times in the process or (3) modulate between a predetermined current or voltage and no current or no voltage at all. Wafer carrier assembly 902 and wafer 904 may rotate about an axis while the platen assembly and polishing surface move in a rotational, orbital, or linear pattern. In addition, wafer carrier assembly 902 and wafer 904 may oscillate relative to the polishing surface. Adjusting the various conditions of the electrochemical deposition process, such as the electric potential, distance between the electric conductors and the wafer surface, conductivity of the electrolyte solution, temperature, and the like, permits suitable control of the uniformity and rate of deposition or planarization of conductive material onto or from the wafer surface.

FIG. 9 shows the anode of power supply 908 coupled to copper layer 610 and the cathode coupled to copper layer 606 (and therefore to polishing pad 612 via copper pins 906) to effectuate an electrochemical deposition process. It should be clear, however, that by reversing the polarity of power supply 908 (i.e., electrically conductive layer 610 to the cathode and electrically conductive layer 606 to the anode) the process becomes a planarization process. That is, material will be removed from the surface of wafer 904.

Thus, there has been provided an improved method and apparatus for electrochemically depositing, planarizing, and/or polishing a conductive material on a workpiece surface. A potential difference is applied between the platen and a surface of a wafer through the use of upper and lower copper layers and conductive pins through the platen to complete the circuit. This potential difference in the presence of an electrolytic material such as a copper sulfate causes copper to be deposited on or removed from the surface of a semiconductor wafer depending on the polarity of the potential difference. A reservoir is provided for supplying a non-abrasive electrolyte into the region between a polishing pad and the wafer surface. Since the platen and polishing pad are only slightly larger in diameter than the wafer, electrolyte and/or slurry is introduced only under the wafer thus avoiding unwanted distribution of the slurry. The result is a more reliable and easier to manufacture apparatus and method of depositing and/or planarizing a semiconductor wafer.

In the foregoing specification, the invention has been described with reference to specific embodiments. However, it may be appreciated that various modifications and changes can be made without departing from the scope of the invention as set forth in the appended claims. Accordingly, the specification and figures are to be regarded as illustrative rather than as restrictive, and all such modifications are intended to be included within the scope of the present invention.

What is claimed is:

1. An apparatus for performing an electrochemical process on a surface of a workpiece, comprising:

a a platen comprising a first conductive layer in contact with said polishing pad for coupling to a first potential, a second conductive layer for coupling to a second potential, and a first insulating layer disposed between said first and second conductive layers;

a polishing pad overlying said plate, said polishing pad comprising a non-electrically conductive material and including at least one electrically conductive region for coupling to the workpiece and said second conductive layer;

a reservoir for placing an electrolyte solution in contact with said polishing pad and the workpiece; and a carrier configured to carry and press the workpiece against said polishing pad.

2. An apparatus according to claim 1 further comprising a drive mechanism from imparting orbital motion to said platen.

3. An apparatus according to claim 2 wherein said process is a deposition process.

4. An apparatus according to claim 3 wherein said first potential is positive and said second potential is negative.

5. An apparatus according to claim 2 wherein said process is an electro-polishing process.

6. An apparatus according to claim 5 wherein said first potential is negative and said second potential is positive.

7. An apparatus according to claim 2 further comprising at least one channel through said platen for delivering the electrolyte solution to said polishing pad and to the workpiece.

8. An apparatus according to claim 7 wherein said at least one channel comprises a plurality of channels.

9. An apparatus according to claim 8 further comprising a plurality of grooves in said polishing pad to facilitate distribution of the electrolyte solution.

10. An apparatus according to claim 9 further comprising a plurality of apertures in said polishing pad for receiving said electrolyte solution and making electrical contact between said workpiece and said first conductive layer.

11. An apparatus according to claim 10 wherein the cumulative cross-sectional area of said plurality of apertures is substantially half the area of said surface of said workpiece.

12. An apparatus according to claim 10 wherein said plurality of apertures are of at least two different sizes.

13. An apparatus according to claim 8 wherein said at least one electrically conductive region of said polishing pad comprises an array of electrically conductive regions positioned within said polishing pad and electrically coupled to said second conductive layer.

14. An apparatus according to claim 13 wherein said first insulating layer is plastic.

15. An apparatus according to claim 13 wherein said first insulating layer is a non-electrically conductive polymer.

16. An apparatus according to claim 13 wherein said first insulating layer is ceramic.

17. An apparatus according to claim 13 further comprising a plurality of conductive pins for electrically coupling each of said array of electrically conductive regions of said polishing pad to said second conductive layer.

18. An apparatus according to claim 17 wherein each of said plurality of conductive pins is copper.

19. An apparatus according to claim 18 wherein said first and second conductive layers are copper.

20. An apparatus according to claim 19 wherein said first conductive layer has a thickness between 0.1 cm and 3 cm.

21. An apparatus according to claim 20 wherein the thickness of said first conductive layer is approximately one cm.

22. An apparatus according to claim 19 wherein said electrolyte solution comprises copper sulfate.

23. An apparatus according to claim 1 wherein said at least one electrically conductive region of said polishing pad comprises a conductive polymer.

24. An apparatus according to claim 23 wherein said conductive polymer is an epoxy.

25. An apparatus according to claim 24 wherein said non-electrically conductive material of said polishing pad is polyurethane.

26. An apparatus according to claim 24 wherein said conductive polymer has a hardness substantially equal to a hardness of said non-electrically conductive material of said polishing pad.

27. An apparatus according to claim 1 wherein a seed layer of electrically conductive material overlies a surface of the workpiece.

28. An apparatus according to claim 1 further including a second insulating layer underlying said second conductive layer of said platen.

29. An apparatus according to claim 28 further including a support structure underlying said second insulating layer.

30. An apparatus according to claim 1 wherein said platen is rotating during the electrochemical process.

31. An apparatus according to claim 30 wherein said carrier is rotating during the electrochemical process.

* * * * *

UNITED STATES PATENT AND TRADEMARK OFFICE
CERTIFICATE OF CORRECTION

PATENT NO. : 6,802,955 B2
DATED : October 12, 2004
INVENTOR(S) : Emesh et al.

It is certified that error appears in the above-identified patent and that said Letters Patent is hereby corrected as shown below:

Column 12,
Line 19, delete "plate" and add -- platen --.

Signed and Sealed this

Fifteenth Day of February, 2005

JON W. DUDAS
*Director of the United States Patent and Trademark Office*